(12) United States Patent
Menon et al.

(10) Patent No.: US 9,321,214 B2
(45) Date of Patent: Apr. 26, 2016

(54) MASKLESS NANOIMPRINT LITHOGRAPHY

(75) Inventors: Rajesh Menon, Salt Lake City, UT (US); Nicole Brimhall, Aurora, CO (US)

(73) Assignee: University of Utah Research Foundation, Salt Lake City, UT (US)

( * ) Notice: Subject to any disclaimer, the term of this patent is extended or adjusted under 35 U.S.C. 154(b) by 314 days.

(21) Appl. No.: 14/232,185

(22) PCT Filed: Jul. 13, 2012

(86) PCT No.: PCT/US2012/046738
§ 371 (c)(1),
(2), (4) Date: May 12, 2014

(87) PCT Pub. No.: WO2013/010111
PCT Pub. Date: Jan. 17, 2013

(65) Prior Publication Data
US 2015/0036117 A1    Feb. 5, 2015

Related U.S. Application Data

(60) Provisional application No. 61/507,501, filed on Jul. 13, 2011.

(51) Int. Cl.
*G03B 27/32* (2006.01)
*G03B 27/42* (2006.01)
*G03F 1/00* (2012.01)
(Continued)

(52) U.S. Cl.
CPC ............. *B29C 59/16* (2013.01); *B29C 59/02* (2013.01); *B82Y 10/00* (2013.01); *B82Y 40/00* (2013.01); *G03F 7/0002* (2013.01); *G03F 7/0015* (2013.01); *B29C 2059/023* (2013.01); *B29K 2101/00* (2013.01)

(58) Field of Classification Search
CPC .. B29C 59/02; B29C 59/16; B29C 2059/023; B29K 2101/00; B82Y 10/00; B82Y 40/00; G03F 7/0002; G03F 7/0015
USPC ................. 264/293; 355/53, 72, 77; 425/385; 430/322; 977/887
See application file for complete search history.

(56) References Cited

U.S. PATENT DOCUMENTS 4,784,963 A   11/1988   Krimmel et al.
5,877,045 A   3/1999    Kapoor
(Continued)

FOREIGN PATENT DOCUMENTS

EP   1533657 A1   5/2005
EP   1708022 A1   10/2006
EP   1748316 A2   1/2007

OTHER PUBLICATIONS

Austin et al.; Fabrication of 70 nm channel length polymer organic thin-film transistors using nanoimprint lithography; Applied Physics Letters; Dec. 2002; pp. 4431-4433; vol. 81, Issue 23; American Institute of Physics.
(Continued)

*Primary Examiner* — Colin Kreutzer
(74) *Attorney, Agent, or Firm* — Thorpe North & Western, LLP

(57) ABSTRACT

A method for creating a nanoimprint lithography template includes exposing (600) a mass transport layer of material adjacent to a support substrate to electromagnetic radiation in a predetermined pattern to form a nanoimprint lithography template in the mass transport layer.

19 Claims, 9 Drawing Sheets

(51) Int. Cl.
| | |
|---|---|
| B29C 59/16 | (2006.01) |
| G03F 7/00 | (2006.01) |
| B82Y 10/00 | (2011.01) |
| B82Y 40/00 | (2011.01) |
| B29C 59/02 | (2006.01) |
| B29K 101/00 | (2006.01) |

(56) References Cited

U.S. PATENT DOCUMENTS

| | | | |
|---|---|---|---|
| 6,312,134 | B1 | 11/2001 | Jain et al. |
| 6,887,770 | B2 | 5/2005 | Ueda et al. |
| 7,509,240 | B2 | 3/2009 | Das et al. |
| 7,666,580 | B2 | 2/2010 | Menon et al. |
| 7,667,819 | B2 | 2/2010 | Menon et al. |
| 7,713,684 | B2 | 5/2010 | Menon et al. |
| 7,714,988 | B2 | 5/2010 | Menon et al. |
| 8,030,121 | B2 | 10/2011 | Meyers |
| 2009/0085255 | A1 | 4/2009 | Tada et al. |
| 2009/0214686 | A1 | 8/2009 | Sreenivasan et al. |
| 2009/0263631 | A1 | 10/2009 | Sakamoto et al. |
| 2009/0264317 | A1 | 10/2009 | Ofir et al. |
| 2010/0068489 | A1 | 3/2010 | Kobrin et al. |
| 2010/0084376 | A1 | 4/2010 | Khusnatdinov et al. |

OTHER PUBLICATIONS

Barrett et al.; Mechanism of Optically-Inscribed High Efficiency Diffraction gratings in Azo Polymer Films; Journal of Physical Chemistry; May 1996; pp. 8836-8842; vol. 100, No. 21; American Chemical Society.
Bian et. al. Single laser beam-induced surface deformation on azobenzene polymer films; Applied Physics Letters; Sep. 1998; pp. 1817-1819; vol. 73, Issue 13; American Institiute of Physics.
Bouchouit et al.; Study of Surface relief gratings on azo organometallic films in picoseconds regime; Optics Express; Sep. 2008; pp. 15633-15639; vol. 16, No. 20; The Optical Society.
Delaire et al.; Linear and Nonlinear Optical Properties of Photochromic Molecules and Materials; Chemical Reviews; Mar. 2000; pp. 1817-1846; vol. 100, No. 5; American Chemical Society.
Dumarcher et al.; Polymer thin-film distributed feedback tunable lasers; Journal of Optics A: Pure and Applied Optics; Jan. 2000; pp. 279-283 ; vol. 2, No. 4.
Egami et al.; Two-Stage Optical Data Storage in Azo Polymers; Japanese Journal of Applied Physics; Mar. 2000; pp. 1558-1561; vol. 39, Part 1, No. 3B; IOP Publishing.
Fabbri et al.; Alternating photinduced mass transport triggered by light polarization in azobenzene containing sol-gel films; Applied Physics Letters; Feb. 2010; pp. 081908-081908-3; vol. 96, No. 8; American Institute of Physics.
Falconnet et al.; A novel approach to Produce Protein Nanopattern s by combining Nanoimprint Lithography and Molecular Self-Assembly; Nano Letters; Sep. 2004; pp. 1909-1914; vol. 4, No. 10; American Chemical Society.
Gerbreders et al.; Holographic Recording in Photochrome-Chalcogenide Composites; Lithuanian Journal of Physics; Mar. 2010; pp. 47-53; vol. 50, No. 1; Lithuanian Physical Society/ Lithuanian Academy of Science.
Gerbreders et al.; Holographic recording in polymer composites of organic photochromes and chalcogenides; Proceedings of SPIE vol. 7142, Sixth International Conference on Advanced Optical Materials and Devices (AOMD-6); Dec. 2, 2008; pp. 714212-1-714212-10; vol. 7142; Sixth International Conference on Advanced Optical Materials and Devices (AOMD-6).
Greener et al.; Rapid, cost-efficient fabrication of microfluidic reactors in thermoplastic polymers by combining photolithography and hot embossing; Lab on a Chip; Feb. 2010; pp. 522-524; vol. 10, No. 4; Royal Society of Chemistry.
Guo et al.; Fabrication of Size-Controllable Nanofluidic Channels by Nanoimprinting and its Application for DNA Stretching; Nano Letters; 2004; pp. 69-73; vol. 4, Issue 1; American Chemical Society.

Guo et al.; Nanoscale silicon field effect transistors fabricated using imprint lithography; Applied Physics Letters; Sep. 1997; pp. 1881-1883; vol. 71, Issue 13; American Institute of Physics.
Harada et al.; Spatial Light Modulators and Surface Relief Gratings Using an Electrooptic Polymer; IPAP Books 2; Nov. 2004; pp. 187-192; Institute of Pure and Applied Physics.
Irie et al.; Reversible Surface Morphology Changes of a Photochromic Diarylethene Single Crystal by Photoirradiation; Science; Mar. 2001; pp. 1769-1772; vol. 291; American Association for the Advancement of Science.
Jansen et al.; Comparative study of different probing techniques for the analysis of the free volume distribution in amorphous glassy perfluoropolymers; Macromolecules; Sep. 2009; pp. 7589-7604; vol. 42, No. 19; American Chemical Society.
Ji; Maskless Resistless Ion Beam Lithography Process; Dissertation; Mar. 10, 2003; 128 pages; University of California, Berkeley.
Jiang et al.; Polarization Dependent Recordings of Surface Relief Gratings on Azobenzene Containing Polymer Films; Applied Physics Letters; May 1996; pp. 2618-2620; vol. 68, No. 19; American Institute of Physics.
Kaufmann et al.; Stamps, inks and substrates: polymers in microcontact printing; Polymer Chemistry; Jun. 2010; pp. 371-387; vol. 1, Issue 4; Royal Society of Chemistry.
Kulikovska et al.; Generation of microstructures in novel supramolecular ionic materials based on azobenzene; Proceedings of SPIE vol. 6999, Organic Optoelectronics and Phototronics III; 12 pags; May 2008; SPIE.
Kulikovska et al.; Smart ionic sol—gel-based azobenzene materials for optical generation of microstructures; Chemistry of Materials; vol. 20, No. 10; American Chemical Society.
Kumar et al.; Gradient force: The mechanism for surface relief grating formation in azobenzene functionalized polymers; Applied Physics Letters; Jan. 1998; pp. 3096-2098; vol. 72; American Institute of Physics.
Lefin et al.; Anisotropy of the photoinduced translation diffusion of azo-dyes; Optical Materials; Jan. 1998; pp. 323-328; vol. 9, Issues 1-4; Elsevier.
Li et al.; Fabrication of circular optical structures with a 20nm minimum feature size using nanoimprint lithography; Applied Physics Letters; Feb. 2000; pp. 673-675; vol. 76, No. 6; American Institute of Physics.
Nagata et al.; Novel Optical Properties of conducting polymer-photchromic polymer systems; Synthetic Metals; Mar. 2001; pp. 607-608; vol. 119, Issues 1-3; Elsevier.
Natansohn et al.; Photoinduced Motions in Azo-Containing Polymers; Chemical Reviews; Oct. 2002; pp. 4139-4176; vol. 102, No. 11; American Chemical Society.
Natansohn et al.; Reversible Optical Storage in Azo Polymers; Progress in Pacific Polymer Science; Dec. 1993; 11 pages; vol. 3; Springer.
Packard et al.; Microcontact-printing based patterning techniques for OLED displays and other microelectronic devices; Presentation; Downloaded May 6, 2011; 25 pages; Massachusetts Institute of Technology.
Patterson et al.; Optically inscribed surface relief diffraction gratings on azobenzene-containing polymers for coupling light into slab waveguides; Applied Physics Letters; Nov. 1996; pp. 3318-3320; vol. 69, No. 22; American Institute of Physics.
Rocha et al.; Laser emission in periodically modulated polymer films; Journal of Applied Physics; Mar. 1, 2001; pp. 3067-3069; vol. 89, No. 5; American Institute of Physics.
Rochon et al.; Efficiency of Reversible Optical Storage in Azo Polymers; Proceedings of SPIE meeting 1993, vol. 2042 "Photopolymers and Applications in Holography, Optical Darta Storage, Optical Sensors and Interconnects"; Nov. 1993; 8 pages; vol. 2042; International Society for Optical Engineering.
Rochon et al.; Guided mode resonance filters using polymer films; Applied Physics Letters; Aug. 1997; pp. 1008-1010; vol. 71, No. 8; American Institute of Physics.
Rochon et al.; Optically induced High Efficiency Gratings in Azo Polymer Films; Polymer Preprints; Jun. 1994; pp. 154-157; American Chemical Society.

(56) References Cited

OTHER PUBLICATIONS

Rochon et al.; Optically induced surface gratings on azoaromatic polymer films; Applied Physics Letters; Jan. 9, 1995; pp. 136-138; vol. 66, No. 2; American Institiute of Physics.

Seki et al.; Light-driven organized layer materials; Molecular Crystals and Liquid Crystals; 2005; pp. 107-114; vol. 430; Taylor and Francis Inc.

Seki et al.; Photoalignment and patterning of nanostructures in liquid crystalline thin films; Proceedings of SPIE vol. 7050, Liquid Crystals XII; Aug. 27, 2008; 12 pages; vol. 7050; SPIE.

Stockermans et al.; Narrow-band resonant grating waveguide filters constructed with azobenzene polymers; Applied Optics; pp. 3714-3719; vol. 38, Issue 17; The Optical Society.

Sun et al.; Optimization and experimentation of nanoimprint lithography based on FIB fabricated stamp; Microelectronic Engineering; Oct. 2005; pp. 175-179; vol. 82, Issue 2; Elsevier.

Tripathy et al.; Holographic fabrication of polarization selective defractive optical elements on azopolymer film; Polymers for advanced technologies; Aug.-Dec. 2000; pp. 570-574; vol. 11, Issue 8-12; John Wiley & Sons, Ltd.

Ubukata et al.; Reversible photoinduced surface relief formation using photochromic compounds (Abstract); Polymer Preprints, Japan (Conference: 55$^{th}$ Society of Polymer Science Japan Symposium on Macromolecules); Sep. 2006; pp. 3306-3307 (Abstract 1 page); vol. 55, No. 2; Society of Polymer Science.

Ubukata et al.; Reversible phototriggered micromanufacturing using amorphous photoresponsive spirooxazine film; Journal of Materials Chemistry, May 2009; pp. 3373-3377; vol. 19; Royal Society of Chemistry.

Viswanathan et al.; Surface Relief Structures on Azo Polymer Films; Journal of Materials Chemistry; Sep. 1999; pp. 1941-1955; Issue 9; Royal Society of Chemistry.

Yager et al.; All-optical patterning of azo polymer films; Current opinion in solid state and materials science; Dec. 31, 2001; pp. 487-494; vol. 5, Issue 6; Elsevier.

Yamaki et al.; Surface relief gratings generated by a photocrosslinkable polymer with styrylpyridine side chains; Applied Physics Letters; Apr. 2000; pp. 2520-2522; vol. 76; American Institute of Physics.

Yu et al.; Reflective polarizer based on a stacked double-layer subwavelength metal grating structure fabricated using nanoimprint lithography; Applied Physics Letters; Aug. 14, 2000; pp. 927-929; vol. 77, No. 7; American Institute of Physics.

PCT Application PCT/US2012/046738; filed Jul. 13, 2012; University of Utah Research Foundation et al.; International Search Report mailed Jan. 30, 2013.

(a)

(b)

(c)

(d)

(e)

Exposing a mass transport layer of material adjacent to a substrate to electromagnetic radiation in a predetermined pattern to form a mass transport layer topography in the mass transport layer defining a nanoimprint lithography template. ⁓ 600

*FIG. 9*

MASKLESS NANOIMPRINT LITHOGRAPHY

RELATED APPLICATIONS

This application claims priority to U.S. Provisional Application No. 61/507,501, filed Jul. 13, 2011 which is incorporated herein by reference.

BACKGROUND

Nanoimprint lithography (NIL) is a method of fabricating nanometer scale patterns that boasts low cost, high resolution, and high throughput and has been used to fabricate devices for electrical, optical, and biological applications. As shown in FIG. 1, NIL creates patterns by mechanical pressing of an imprint resist using a template mold (or simply "template"). The imprint resist is typically a polymer formulation that is cured by heat or UV (ultraviolet) light during the imprinting process. The mold is then released, leaving a pattern in the cured resist. A pattern transfer process (such as reactive ion etching) can be used to transfer the pattern in the resist to the underlying substrate to form a wide variety of structures.

Some challenges associated with NIL are the fabrication of the template and durability of the template. High resolution template patterning is commonly performed with electron beam lithography or focused ion beam patterning. However, at smaller resolutions the throughput for these techniques can be very low. For example, an electron beam lithography method can take a significant amount of time to cover a 15 cm diameter substrate with a dense pattern of 10 nm features. Optical patterning of templates has been demonstrated, but conventional photolithography is limited in resolution to relatively large features (i.e. generally greater than approximately 200 nm feature sizes). Wear of the template can also be a significant concern in NIL. Physical contacting of the template with the resist layer during imprinting accelerates the wear of imprint templates compared to other types of lithographic masks.

SUMMARY

A method for creating a nanoimprint lithography template according to an example of the present technology includes exposing a mass transport layer of material adjacent to a support substrate to electromagnetic radiation in a predetermined pattern to form a nanoimprint lithography template in the mass transport layer.

A nanoimprint lithography system in accordance with an example of the present technology can include a mass transport support substrate transmissive to electromagnetic radiation. A mass transport layer can be disposed adjacent to the substrate. The system can include an electromagnetic radiation source positioned to emit electromagnetic radiation toward the mass transport layer, inducing a topography, to create a nanoimprint lithography template. The system can also include a nanoimprint lithography template eraser operable to erase the nanoimprint lithography template.

BRIEF DESCRIPTION OF THE DRAWINGS

FIG. 9 is a flow diagram of a method for creating a nanoimprint lithography template in accordance with an example of the present technology.

DETAILED DESCRIPTION

Figure 1:
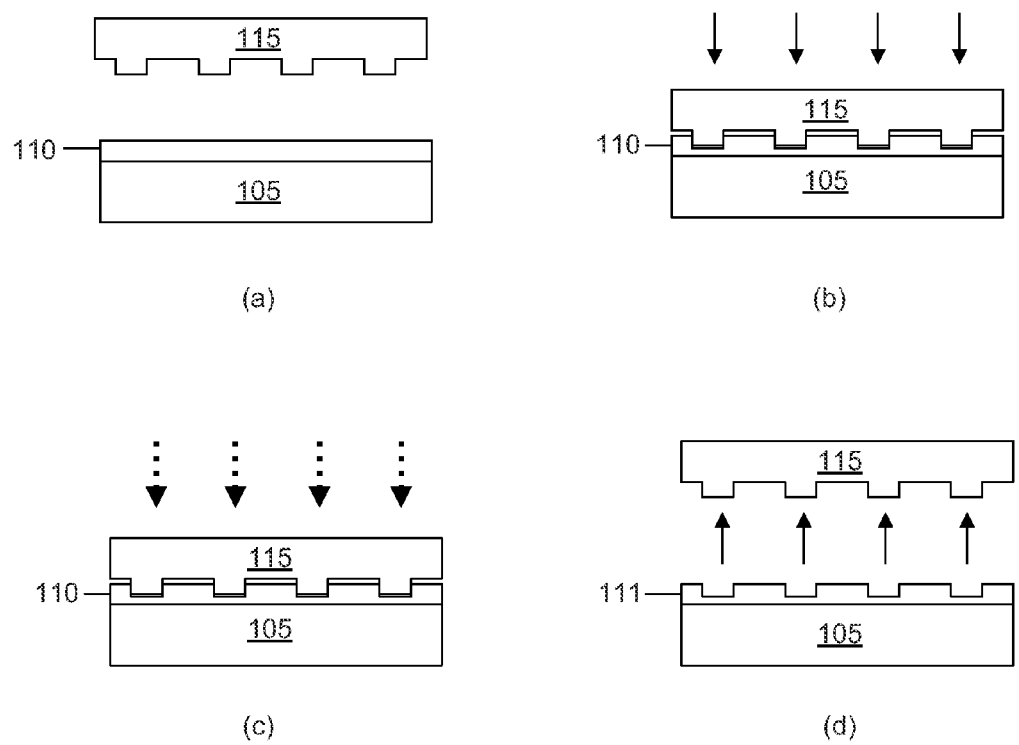
FIG. 1 is a series of side views of a nanoimprint lithography template and imprint layer over a substrate illustrating conventional nanoimprint lithography technology in accordance with the prior art.

Reference will now be made to the exemplary embodiments illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

Definitions

As used herein, the terms "light" and "electromagnetic radiation" can be used interchangeably and can refer to light or electromagnetic radiation in the ultraviolet, visible, near infrared and infrared spectra. The terms can further more broadly include electromagnetic radiation such as radio waves, microwaves, x-rays, and gamma rays. Thus, the term "light" is not limited to electromagnetic radiation in the visible spectrum.

As used herein, a "substrate" can refer to any of a variety of materials, layers, etc. For example, in terms of a semiconductor, the "substrate" can refer to a silicon wafer, or can refer to any of a variety of dielectric, conductive, or other layers in the semiconductor. Other materials can be used as a substrate as well. For example, a mass transport layer can be supported by a substrate of almost any material having sufficient mechanical integrity to preserve a template during use. In some cases, the substrate can be rigid. However, flexible substrates can also be used. For purposes of this disclosure, the substrate can generically refer to a layer or material capable of supporting another layer or material thereon.

It is noted that, as used in this specification and the appended claims, the singular forms "a," "an," and "the" include plural referents unless the context clearly dictates otherwise. Thus, for example, reference to "a layer" includes one or more of such features, reference to "an emitter" includes reference to one or more of such devices, and reference to "pressing" includes reference to one or more of such steps.

As used herein, the terms "about" and "approximately" are used to provide flexibility, such as to indicate, for example, that a given value in a numerical range endpoint may be "a little above" or "a little below" the endpoint. The degree of flexibility for a particular variable can be readily determined by one skilled in the art based on the context.

As used herein, the term "substantially" refers to the complete or nearly complete extent or degree of an action, characteristic, property, state, structure, item, or result. The exact allowable degree of deviation from absolute completeness may in some cases depend on the specific context. However, the nearness of completion will generally be so as to have the same overall result as if absolute and total completion were obtained. The use of "substantially" is equally applicable when used in a negative connotation to refer to the complete or near complete lack of an action, characteristic, property, state, structure, item, or result.

As used herein, a plurality of components may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

Examples of the Technology

Reference will now be made to the exemplary embodiments illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

With the general examples set forth in the Summary above, it is noted in the present disclosure that when describing the system, or the related devices or methods, individual or separate descriptions are considered applicable to one other, whether or not explicitly discussed in the context of a particular example or embodiment. For example, in discussing a device per se, other device, system, and/or method embodiments are also included in such discussions, and vice versa.

Furthermore, various modifications and combinations can be derived from the present disclosure and illustrations, and as such, the following figures should not be considered limiting.

Nanoimprint lithography (NIL) is a technology that enables the rapid, low-cost replication of nanostructures over large areas. FIG. 1 illustrates a known nano-imprint lithography process. In FIG. 1(a), a substrate 105 is coated with a layer of imprint resist 110. A template mold 115 is also provided which has a pattern which is inverse to a desired pattern to be imprinted in the layer of imprint resist. At FIG. 1(b), the template mold 115 is pressed into the resist to form a pattern within the imprint resist. In FIG. 1(c), the patterned resist is cured using UV light or heat. In FIG. 1(d), the template is released, leaving the imprinted pattern 111 in the resist. Subsequent processing steps can involve etching, deposition and other standard semiconductor processing or nano-processing steps.

One challenge in NIL is the difficulty involved in efficient fabrication of the template. The present technology enables maskless NIL where the template is reconfigurable using electromagnetic radiation. The present technology uses reversible topography generation by light-induced molecular mass transport. Light-induced molecular mass transport is particularly prevalent in photochromic molecules, although other materials can demonstrate light-induced molecular mass transport as well, some examples of which are described herein.

The present technology includes a technique for maskless NIL, where a reversible template is created using mass-transport characteristics of molecules, such as photochromic molecules. This technique can allow high-throughput fabrication of templates with nanoscale features over macroscopic areas. Also, because the template fabrication is reversible, many issues with template wear can be avoided as will be further understood by the follow discussion.

Reversible molecular mass transport can be observed in photochromic molecules. For example, surface relief gratings (SRGs) can be directly recorded or formed at room temperature on azobenzene-containing polymer films using an interference pattern created in an argon-ion laser beam. Micro- and nano-structures can be created in a multitude of azobenzene-based systems as well as in diarylethene- and spirooxazine-based systems, for example, using molecular mass transport.

In an example molecular mass transport application, two coherent laser beams, with a wavelength in the photochrome absorption band, are intersected at the photochrome-film surface. The sinusoidal light interference pattern at the sample surface leads to a sinusoidal surface patterning, i.e., a surface relief grating. These gratings are found to have a significant depth in azobenzene films, such as up to several hundred nanometers. The process can be performed readily at room temperature with moderate irradiation (1-100 mW/cm2) over time periods ranging from seconds to minutes. The process is also reversible. For example, a flat film with the original film thickness is recoverable upon heating the film material above the material's glass transition temperature. The patterning is lost as the material returns to a planar shape. The process can include the presence and isomerization of photochromic molecules. Some absorbing but non-isomerizing chromophores do not produce SRGs.

SRGs are patterns that can be conveniently generated and easily monitored. However, molecular mass transport can produce arbitrary patterns. For example, a single focused Gaussian laser spot can lead to a localized depression or protrusion, a Gaussian line can lead to an elongated trench or peak, and so forth. In practice, any arbitrary pattern can be generated through an appropriate mask, interference setup, and/or scanning of a laser spot.

Molecular mass transport, according to at least one model, is related to isomerization pressure. At low light intensities, photochromic molecules undergo photocyclization reactions. Because one isomer in a group of isomers typically occupies significantly smaller volume than another isomer in the group, there is a pressure that forces the molecules that occupy larger volume to move. This model, although able to explain several experimental results, falls short of explaining an observed light-polarization dependence property of mass transport. Two other models (i.e., the diffusion model and the field-gradient force model) explain the polarization dependence, but may yet be incomplete.

Molecular mass transport can provide a basis for numerous applications. Photochromic isomers, especially azobenzene-based photochromic isomers, can be very versatile, amenable to incorporation in a wide variety of materials, and the mass patterning is reversible. Surface relief gratings generated with molecular mass transport may operate as optical polarizers, angular or wavelength filters, and couplers for optical devices. Surface relief gratings generated with molecular mass transport can also be used as photonic band gap materials and to create lasers where emission wavelength is tunable via selectively variable grating pitch. Surface relief gratings generated with molecular mass transport can also be used as an optical data storage mechanism.

Suitable mass transport layer materials can be illuminated by a suitable wavelength of light to induce molecular migration away from or towards the peaks of light intensities in a rapid fashion resulting in surface deformation. In most cases, such deformation can be reversible either by exposure to a different wavelength or exposure to circular polarized light of the same or different wavelength, or by local or global heating of the material. Classes of materials which tend to satisfy these criteria include, but are not limited to, certain forms of photochromic, thermochromic or solvatochromic materials. Non-limiting examples of such materials can include azobenzenes, spiro-oxazines, diarylethenes, spiropyrans, photochromic quinines, sol-gels, and any other photoresponsive materials. These materials may be doped into a polymer matrix (PMMA, epoxy, PVP, PVA, or the like), within a sol-gel, or be deposited by themselves as thin films. The mass transport materials can be molecules doped in a polymer matrix, photochromic polymers, small molecules deposited as thin films, molecules doped in sol-gels, and the like, as well as combinations thereof. In a specific example, the material can include a diarylethene-based photochromic material. Specific non-limiting examples of suitable azobenzenes can include poly(disperse red 1) acrylate (i.e. [4-(N-(2-hydroxyethyl)-n-ethyl)-amino-4'-nitroazobenzene doped in a PMMA matrix), HEMA-DR13, HPDR13, DR19-IPDI, DR19-MDI, poly[4'-[[2-(acryloyloxy)ethyllethy lamino]4-nitroazobenzene] (pDR1A), pDR13A, pDO3AA, poly[4-(2-methacryloyloxy)ethyl-azobenzene (pMEA), pDR19T, poly-orange tom-1 isophoronedisocyanate, cyanoazobenzene dye, and others. Specific non-limiting examples of suitable spiro-oxazines can include 1,3,3-trimethylspiro [indoline-2,3'-[3H] naphtho [2,1-B][1,4]oxazine], 1',3',3'-trimethyl-6-nitrospiro [2H-1-benzopyran-2,2'-indoline], 9'-hydroxy-1,3,3-trimethylspiro[indoline-2,3'[3H]naphtha[2,1-b]-1, 4oxazine], thieno[3,2-b]pyrrolenine based spirooxazines, spiro [azahomoadamantane-isoquinolinoxazine], 1,3,3 -trimethyl-5'-(2-benzothiazolyl)-spiroindoline-2,3'-naphtho(2, 1-b)(1,4) oxazine, and the like. Specific non-limiting examples of suitable diarylethenes can include bis-bithienylethene, 1,2-bis(2,4-dimethyl-5-phenyl-3-thienyl)perfluorocyclopentene, 1,2-bis(2,5-dimethyl-3-theinyl)perfluorocyclopentene, and the like. Non-limiting examples of photochromic quinines includes phenoxynaphthacene quinine. The above examples are intended to be non-limiting as any molecule which exhibits light induced transport (i.e. migration) can be used.

The present technology applies molecular mass transport principles to NIL to avoid the conventional patterning of a mask/template for NIL and enables a maskless version of NIL. The technology uses the photo-reconfigurable generation of surface morphology to create the desired template topography before an imprint step. A process consistent with this approach is illustrated in FIG. 2.

Figure 2:
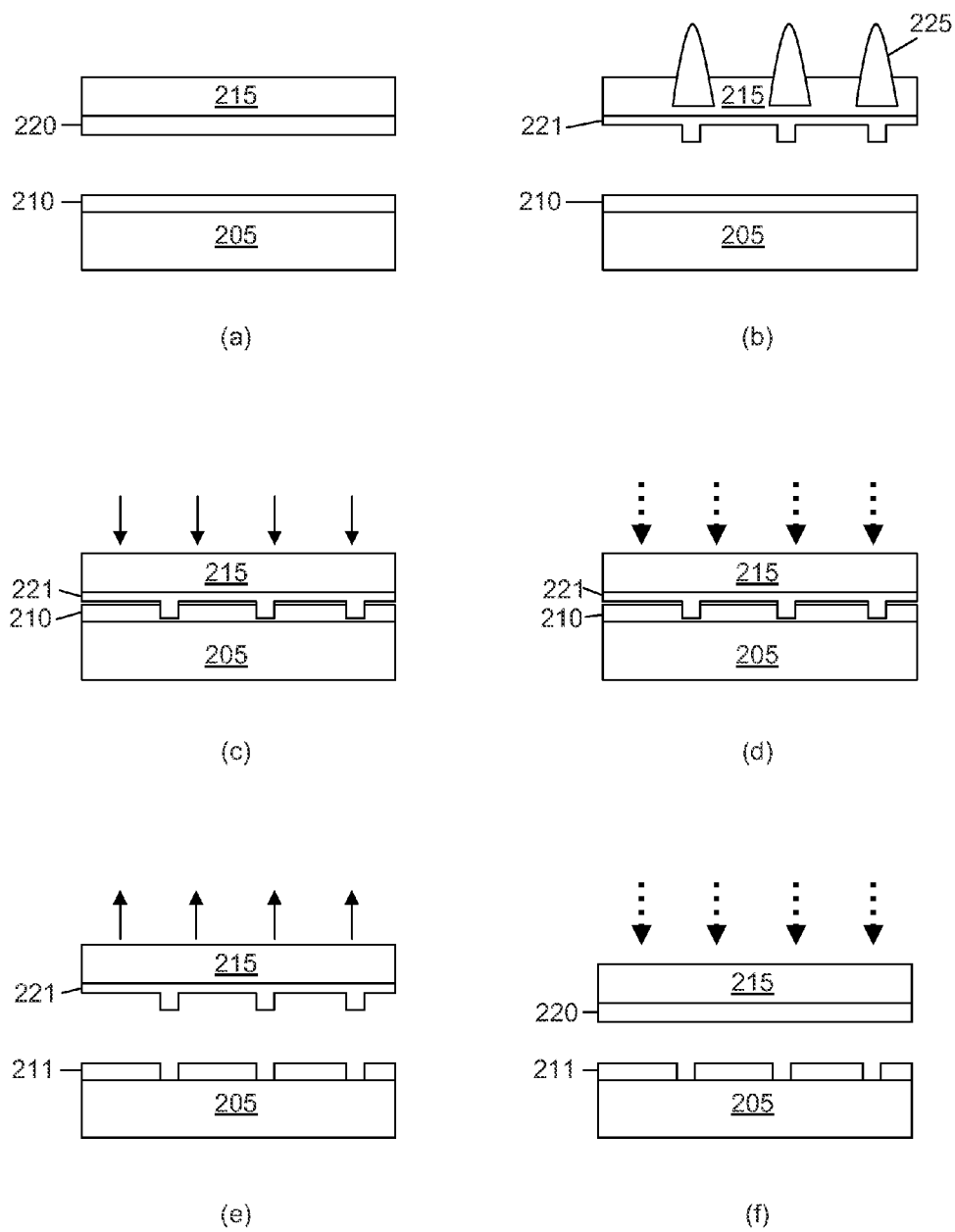
FIG. 2 is a series of side views of a nanoimprint lithography template and imprint layer over a substrate illustrating a nanoimprint lithography process according to an example of the present technology.

FIG. 2 illustrates a maskless nano-imprint lithography process. A template can include a transparent substrate 215 such as quartz, fused silica or glass. The substrate can be coated with a film 220 of mass-transport molecules as illustrated. The substrate and the film together can comprise the template. The film can comprise a mass-transport layer (MTL). In FIG. 2(b) an exposure of the MTL to electromagnetic radiation 225 with the desired pattern is performed to induce a topography 221 in the MTL. The exposure to the electromagnetic radiation initiates mass transport of the molecules from high-intensity regions to low-intensity regions in the case of a positive-tone template or vice-versa for a negative-tone template. The tone can be selected by appropriate choice of the molecules. Transparent substrates can allow passage of electromagnetic radiation which triggers mass transport within the MTL. In this case, the exposure of the MTL can come to the MTL on an opposite side from the substrate. In general, a sharpness of a topography feature can be determined by the intensity distribution of the illumination shape of the light intensity distribution as well as the mechanism of mass transport. By having an illumination with sharp edges, it is possible to create corresponding sharp edges in the topography.

Once the topography is formed, the template, including the transparent substrate and the MTL, is pressed into a "resist" layer 210 that coats a wafer 205 as shown in FIG. 2(c). The pattern is thus imprinted into the resist in a similar manner as is performed in conventional NIL. As illustrated in FIG. 2(d), the resist can further be cured by exposure to UV radiation. However, in some examples the curing step is optional. The template can remain in an imprinting position during UV illumination when the UV illumination does not affect the MTL. Alternatively, the template can be removed before curing. The template may be separated from the wafer leaving the patterned resist 211, as shown in FIG. 2(e). The topography in the MTL can be erased by exposure to a uniform beam of light or by heating above the glass transition temperature as shown in FIG. 2(f). The wafer can be stepped and more patterns can be imprinted. The topography 221 can be used a predetermined number of times before erasure depending on durability of the MTL material used. In another example, the topography can be recreated before each imprinting to enhance uniformity.

In one example, aspect ratios of the topography can be monitored to ensure that desired sizing, spacing, etc. are obtained when the topography is created and maintained when repeatedly used to achieve a desired end result.

Figure 3:
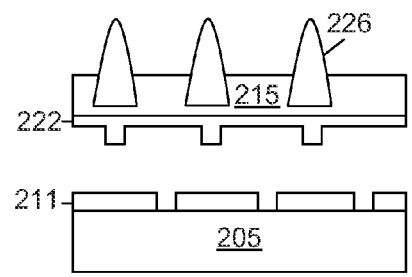
FIG. 3 is a series of side views of a nanoimprint lithography template and imprint layer over a substrate illustrating a nanoimprint lithography process for creating closely spaced imprint features according to an example of the present technology to accompany FIG. 2.
Figure 3:
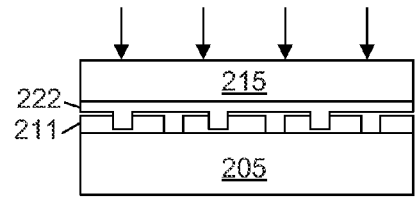
Figure 3:
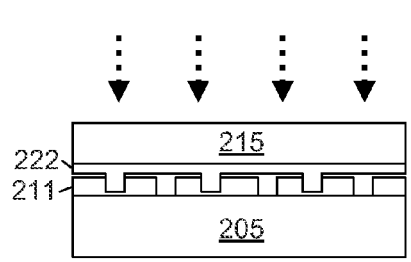
Figure 3:
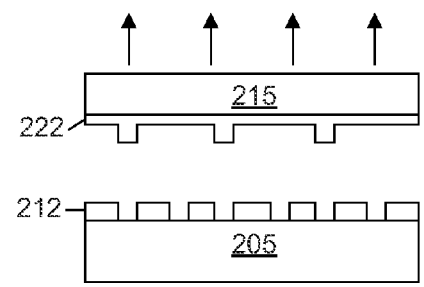
Figure 3:
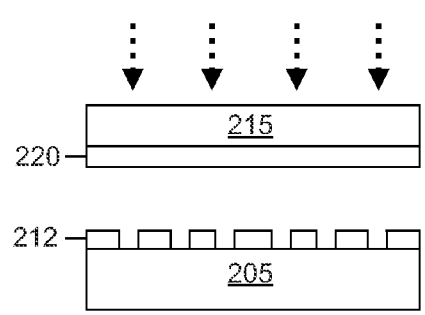

A multi-step imprint process with different patterns is illustrated in FIG. 3. The process of FIG. 3 builds on the process of FIG. 2 by further developing the resist pattern created in the process of FIG. 2. The MTL layer 222 in this example is patterned with a different pattern than previously used. In this example, the MTL pattern is similar to the previous pattern but is offset in a position of the MTL layer from where the previous pattern was created, such as by using a different pattern or position of electromagnetic radiation 226 directed through the transparent substrate 215. As shown in FIG. 3(b), features can be placed closer together in the resist pattern than the far-field diffraction limit since the exposures (that create the pattern on the template) can be separated in time. The template 222 can be imprinted into the patterned resist 211. Referring now to FIG. 3(c), the imprinted resist can be cured with or without the template in place. FIG. 3(d) shows the template released, leaving the multi-step imprint resist pattern 212. As shown in FIG. 3(e), the MTL layer 220 can be erased or reset for further patterning by heating, exposure to uniform illumination, etc.

Figure 4:
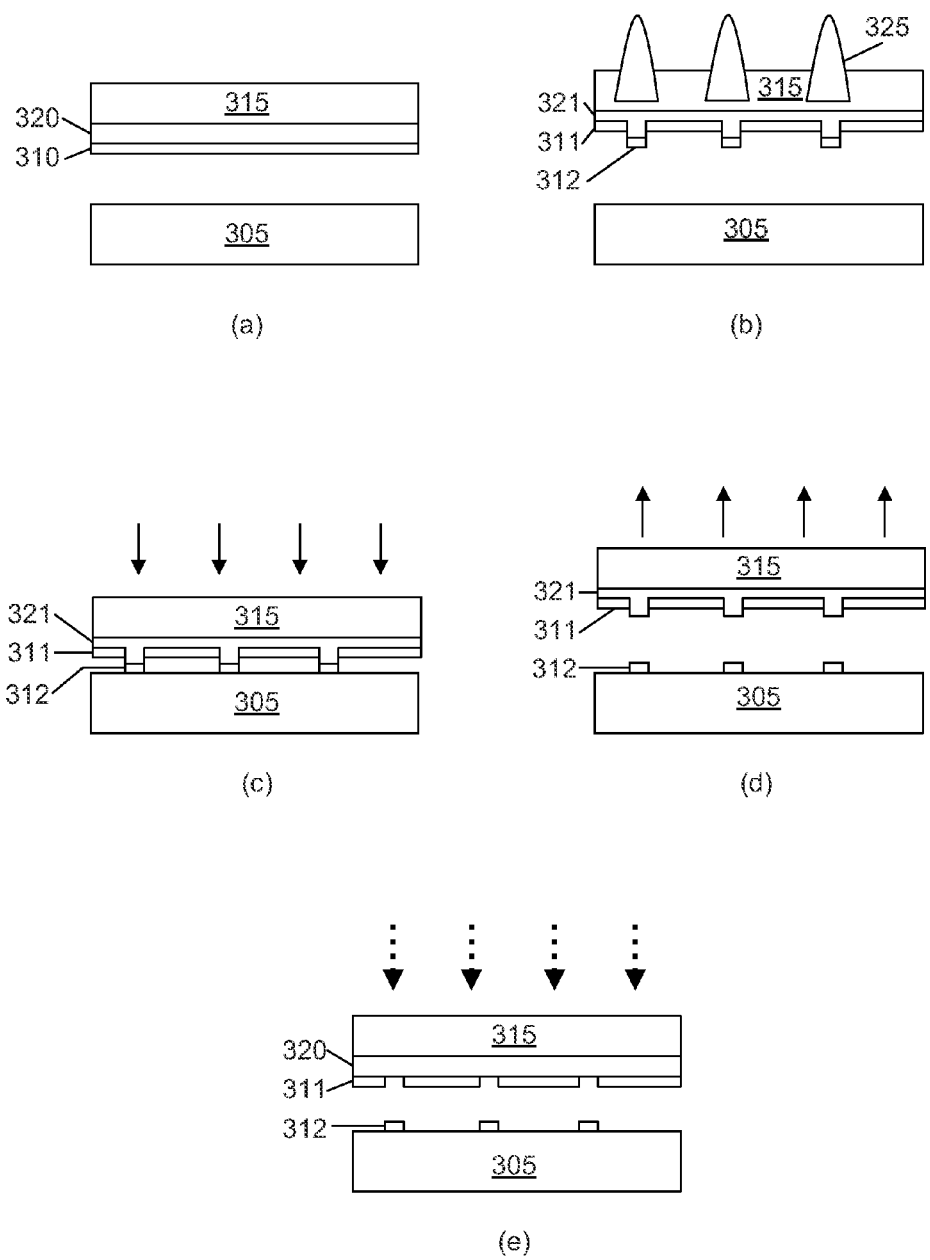
FIG. 4 is a series of side views of a nanoimprint lithography template and imprint layer relative to a substrate illustrating a transfer nanoimprint lithography process according to an example of the present technology.

It is also possible to transfer chemical patterns onto a surface as opposed to topographic patterns. When a mask is used, this method can comprise micro-contact printing. The present technology enables a maskless implementation of micro-contact printing methods. An example of maskless micro-contact printing is illustrated in FIG. 4. As described herein, maskless micro-contact printing is also considered to be within the scope of NIL since a pattern is created over a substrate by pressing one surface against another.

In FIG. 4(a), the transparent substrate 315 is coated not only with a MTL 320, as in the previous embodiment, but also a contact-transfer layer 310. The contact-transfer layer is deformed as the MTL layer is illuminated. The resulting pattern within the contact-transfer layer can be transferred to a corresponding substrate. For example, the contact-transfer layer can comprise a resist material. In this example, a portion of the contact-transfer layer is transferred into a specific geometry on the sample substrate 305 or wafer surface. More specifically, as shown in FIG. 4(b), when the MTL is illuminated by electromagnetic radiation 325, the topography 321 is generated as before. Because the contact-transfer layer is adjacent the MTL, the contact-transfer layer is also deformed in a similar topographical pattern as the MTL, as illustrated in FIG. 4(b). Deformation of the contact-transfer layer can result in one or more contact-transfer portions 312 for transfer to the sample substrate 305 and one or more portions 311 configured to remain with the MTL. In one aspect, the deformation of the contact-transfer layer during illumination of the MTL can result in physical separation of the different portions 311, 312.

In the next step, the template is barely brought into contact with the substrate 305 as illustrated in FIG. 4(c). The contact-transfer layer 311, 312 is chosen of material which adheres more strongly to the substrate than it does to the MTL. As a result, due to the more favorable surface energy, the material in the protruding sections 312 of the MTL adheres to the substrate surface. The substrate surface and/or MTL can be treated to improve this transfer step using a surface treatment (e.g. release layer, functionalization, etc). The template can be separated (FIG. 4(d)) from the substrate and/or transferred contact-transfer layer and the topography can be erased as shown in FIG. 4(e).

Suitable contact-transfer layer materials can exhibit a higher adherence to the substrate (e.g. wafer or other surface) than to the MTL layer for additive patterning. Conversely, for subtractive patterning (lift-off), the contact-transfer layer can be formed as a sheet on the substrate and the imprint template can be brought into contact with the contact-transfer layer to selectively remove or lift-off portions of the contact-transfer layer. In this case, the material can be selected to have a higher adherence to the MTL than to the substrate. The contact-transfer layer can also be formed of material which has sufficiently high rigidity or viscosity to retain the transferred shape resolution (including before and during curing if the material is cured). Another factor in choosing suitable contact-transfer layer materials can include whether the contact-transfer layer coats the MTL and/or the substrate uniformly, whether the contact-transfer layer transfers to the substrate and/or to the MTL rapidly upon contact, and so forth. Suitable contact-transfer layer materials can also be chemically stable and not affected by the illumination or other electromagnetic radiation. Classes of materials which tend to satisfy these criteria include, but are not limited to, polymers, small molecules, biologically active materials such as DNA, protein, etc. Non-limiting specific examples of such materials can include α-NPD (N,N-di(naphthalene-1-yl)-N,N'-diphenyl-benzidine), α-NPD/Alq3 (tris(8-quinolinoato) aluminum), pentacene, NPB (N,N'-bis-(1-naphthl)-diphenyl-1,1'-biphenyl-4,4'-diamine), TPD (thienopyrrolodione), TAZ (3-(4-biphenyl)-4-phenyl-5-(4-tert-butylphenyl)-1,2,4-triazole), TPBi (trimer of N-arylbenzimidazoles), thiols onto gold substrates, PEDOT:PSS, polyanylenes, polythiophenes, PPMA, nanoparticles, polystyrene, poly-ethylene glycol and the like. Although the contact-transfer layer material can often be used as a temporary resist pattern, the resulting patterned layer can also be left in place and form part of a final device feature or layer.

Figure 5:
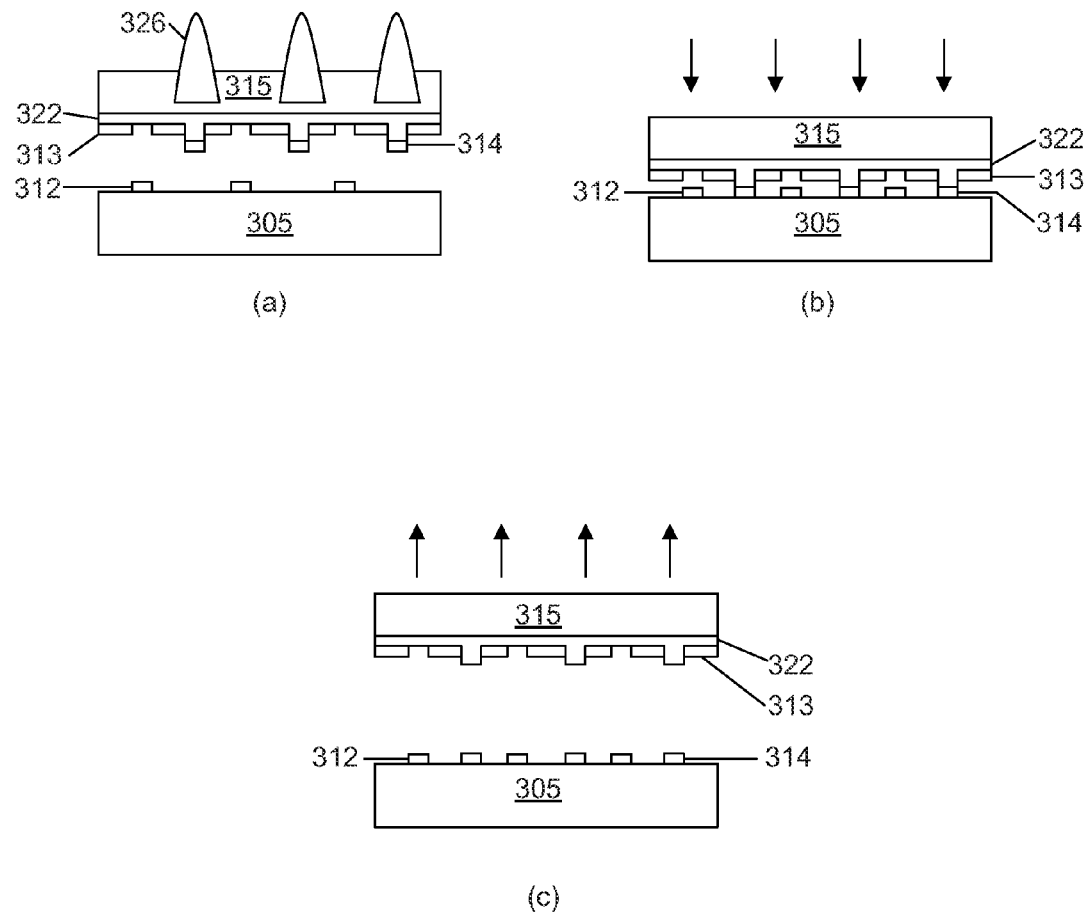
FIG. 5 is a series of side views of a nanoimprint lithography template and imprint layer relative to a substrate illustrating a transfer nanoimprint lithography process for creating closely spaced imprint features according to an example of the present technology to accompany FIG. 4.

As with the NIL processes described with regard to FIGS. 2-3, multiple imprint steps can be performed in the maskless micro-contact printing process illustrated in FIG. 4 in order to obtain dense, complex geometries. The process of performing multiple imprinting steps can provide the opportunity to overcome the optical diffraction limit. FIG. 5 illustrates a schematic of multiple print steps for dense chemical patterns using maskless micro-contact printing and a continuation of the pattern 312 created in the process of FIG. 4. In FIG. 5(a), a different pattern of light 326 illuminates the MTL inducing a different topography 322, leaving contact transfer layer portions 313, 314, with portion 314 being a pattern for transfer to the sample substrate 305. It is noted that the template can utilize the same or different patterns on each subsequent pressing step so as to achieve a wide variety of patterns. FIG. 5(b) shows the contact-transfer portions 314 pressed into contact with the sample substrate 305. As illustrated in FIG. 5(c), the contact-transfer portions 314 are then left on the substrate 305 and can be cured or otherwise further processed. This template and imprinting process can be repeated as many times as needed to obtain a desired pattern of contact-transfer material on the substrate.

Figure 6:
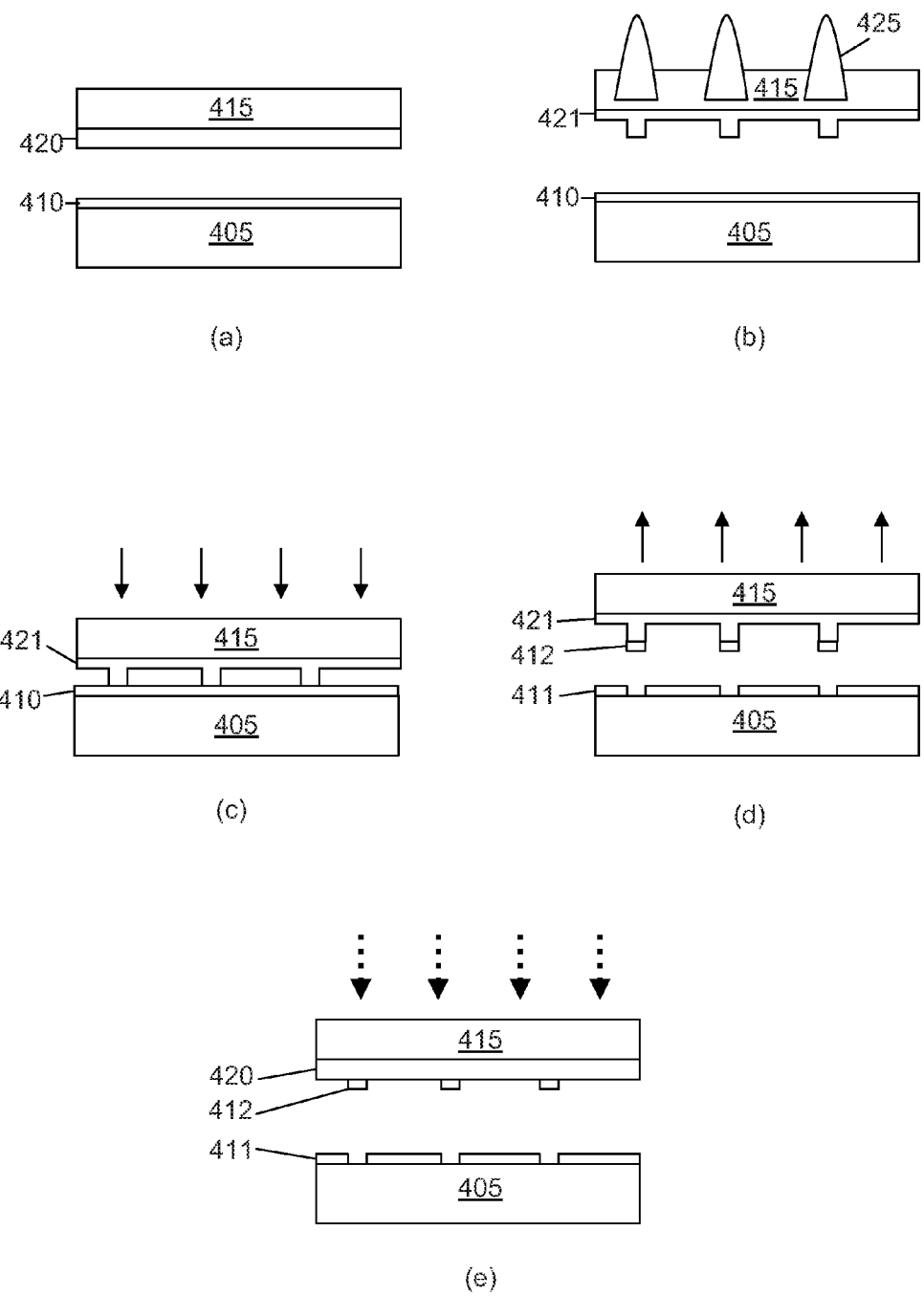
FIG. 6 is a series of side views of a nanoimprint lithography template and imprint layer over a substrate illustrating a nanoimprint lithography process according to an example of the present technology where contact transfer layer material is transferred to the template.

FIG. 6 illustrates a variation of the process shown in FIG. 2. The process begins at FIG. 6(a) with a transparent substrate 415 and MTL 420 as a template and an imprint substrate 405 with a contact transfer layer 410 thereon. As shown in FIG. 6(b), topography 421 is formed in the MTL using illumination 425 as previously described. Referring now to FIG. 6(c), a portion of the contact transfer layer 410 is transferred from the imprint substrate 405 to the extended features in the topography 421 by pressing the topography against the contact transfer layer. The pressing can generally be performed within imprinting or deformation of the contact transfer layer such that sufficient pressure to adhere to the extended feature in the topography is used. In FIG. 6(d) the substrate 415 is lifted away from the substrate 405 such that regions or portions 412 of the contact transfer layer which are adhered are removed. These portions can then be removed from the template prior to reuse (e.g. by washing or dissolution). A patterned contact transfer layer 411 remains on the sample substrate 405. As shown in FIG. 6(e), the MTL 420 can optionally be erased by exposure to uniform radiation and/or heat.

Figure 7:
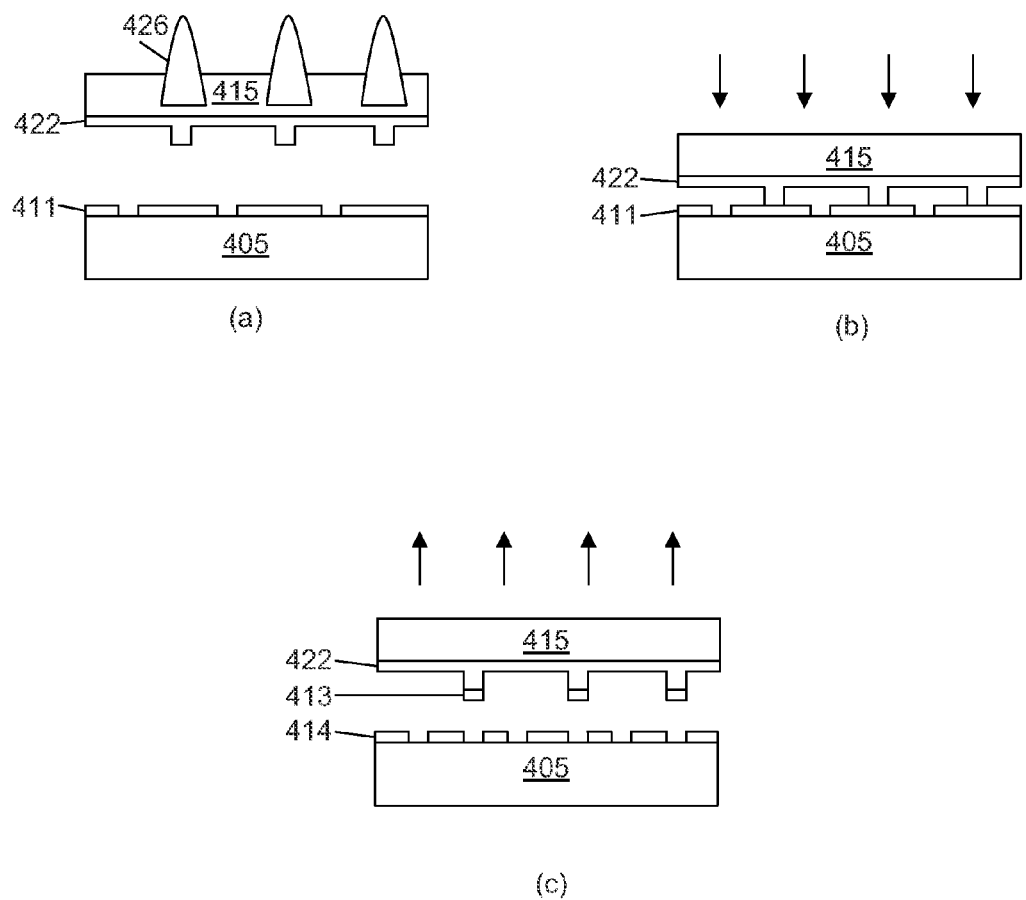
FIG. 7 is a series of side views of a nanoimprint lithography template and imprint layer over a substrate illustrating a nanoimprint lithography process for creating closely spaced imprint features according to an example of the present technology to accompany FIG. 6.

FIG. 7 illustrates a complimentary multi-step approach to the process described by FIG. 6. Specifically, in FIG. 7(a), a different pattern of illumination 426 creates a different topography 422 on the transparent substrate 415. FIG. 7(b) shows the different topography contacting additional regions of the contact transfer layer 411. As before, the extended features of the topography contact regions of the contact transfer layer upon bringing the transparent substrate and the sample substrate together. As shown in FIG. 7(c), the transparent substrate 415 can be removed from the sample substrate 405 so as to remove additional contact transfer layer portions 413, leaving behind a composite patterned contact transfer layer 414.

Figure 8:
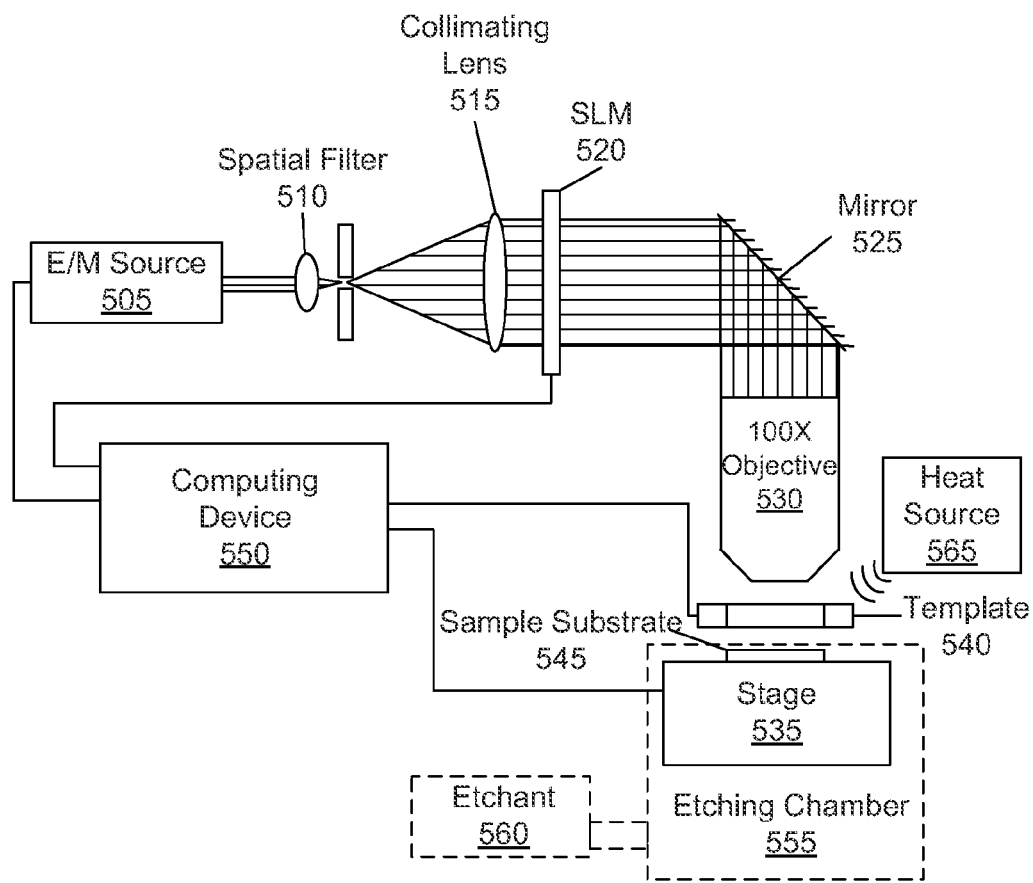
FIG. 8 is a block diagram of a nanoimprint lithography system according to an example of the present technology.

FIG. 8 is a block diagram of an example system for implementing maskless NIL as described in the above processes. The system can include a template 540 including a mass transport support substrate transmissive to electromagnetic radiation. A mass transport layer can be disposed adjacent to the substrate. The system can include an imprint layer adjacent to the mass transport layer or adjacent to a semiconductor material 545 (i.e., sample substrate). The system can include an electromagnetic radiation source 505 positioned to emit electromagnetic radiation toward the mass transport layer, inducing a topography to create a nanoimprint lithography template. The system can also include a nanoimprint lithography template eraser operable to erase the nanoimprint lithography template. In one aspect, the electromagnetic radiation source for inducing the topography can also comprise the nanoimprint lithography eraser and can be operable to either induce topography or erase topography by varying a wavelength, frequency, or intensity of the electromagnetic radiation. The electromagnetic radiation source can also be used for curing the imprint layer (i.e., the resist layer) in some examples.

In a more detailed example, the nanoimprint lithography template eraser is a substantially uniform electromagnetic radiation source 505. In another example, the nanoimprint lithography template eraser is heat source 565 configured to globally or locally heat the mass transport layer.

The system can further include an etching system for etching a semiconductor material according to an imprint of the nanoimprint lithography template. The etching system can be similar to conventional etching systems. In one example, the etching system can include an etching chamber 555 configured to receive an etchant material 560 for etching a pattern on the substrate. For example, the etching system can be configured for dry etching to remove material from a semiconductor material by exposing the semiconductor material to a bombardment of ions that dislodge portions of the semiconductor material from the exposed surface. The bombardment of ions can be an exposure of the semiconductor material to a plasma of reactive gases such as fluorocarbons, oxygen, chlorine, or boron trichloride, which can further include nitrogen, argon, helium and/or other gases.

In one example, the transmissivity of the substrate to the electromagnetic radiation can be variable to enable selective determination of the topography to be induced, as is described in additional detail later. The mass transport layer can include a photochromic material.

The system can include an optical assembly 510, 515, 520, 525, 530 that incorporates a spatial-light modulator (SLM) 520 to generate the patterns in light to illuminate the template. The system also includes actuators (stage 535) for the imprint process, such as for stepping the stage (X,Y) to position the wafer. In order to get accurate alignment between multiple print steps, sensitive Moiré-based optical alignment techniques can be used. FIG. 8 illustrates a transmission-type SLM, but a reflection-type SLM may also be used. It is possible to use an array of microlenses in conjunction with an SLM, such as in a zone-plate-array-lithography architecture. Movement of the stage, operation of the electromagnetic radiation source, and so forth can be controlled using a computing device 550.

In one aspect, the MTL can be more rigid than the resist layer to prevent deformation of the patterns during the imprint process. In some examples, the MTL can be chemically modified or have additives, fillers, etc. added thereto to vary rigidity of the MTL.

When using the system to perform multiple imprinting steps, care can be taken that previously formed patterns are not distorted during a subsequent imprint step. For example, a size of the patterns, the type of resist material, and so forth can limit how closely together the nanostructures can be placed. At least partial curing of the resist between formation of the nanostructures can help at least partially address this limitation. Further, a previous imprint step can be designed to accommodate later deformation from a subsequent step such that the final shape is a desired pattern.

It can be desirable to avoid any adhesion of the MTL to the resist surface, or at least to have less adhesion between the MTL and the resist surface than between the MTL and the substrate. In one example, the MTL can be coated with a thin layer that prevents sticking. Additional optional cleaning steps can be used after imprinting to remove any residual material.

In some examples, the MTL can be used to create patterns using electromagnetic radiation directed toward specific points in the MTL layer. In one aspect, the electromagnetic radiation can be focused to irradiate small areas of the MTL. In another example, the electromagnetic radiation can pass through the substrate where voids are present in the substrate or where the substrate is transparent or translucent. In one aspect, transparency/translucency of the substrate can be selectively varied to use a same substrate to form a variety of different patterns in the MTL. Example selective transparency technology is disclosed in U.S. Pat. Nos. 7,666,580; 7,667,819; 7,713,684; and 7,714,988, which are each incorporated herein by reference in their entirety. In another example, the variably transmissive substrate can, for example, include an electrochromic material configured to change light transmission properties in response to voltage to control an amount of light passing through the material.

After a pattern has been formed on the substrate, using imprint or transfer methods as described above, an etching process can be used to etch within the topography to create features in the substrate. In other words, the topography can form a mask to enable etching of the substrate, as is known in the art. For example, various deposition, etching, and/or lithography techniques may be used after the pattern/topography is created on the substrate. As specific and non-limiting examples of fabrication methods, various metals, dielectric, and other layers can be deposited using sputtering or evaporation processes, physical vapor deposition, chemical vapor deposition, electrochemical deposition, molecular beam epitaxy, and/or atomic layer deposition.

In another alternative, the imprinted and/or transferred layer can be left in place and additional layers deposited using the above-described process or other processes such as, but not limited to, chemical vapor deposition, atomic layer deposition, physical vapor deposition, and the like. Patterned layers can be formed of varying materials so as to produce specific devices (i.e. OLEDs, integrated circuits, micro- or nano-electromechanical systems, solar cells, DNA microarrays, nanophotonic devices, microphotonic devices, integrated optics, plasmonics, metamaterials, etc.).

A variety of semiconductor materials are contemplated for use with the devices and methods according to aspects of the present disclosure. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. Exemplary silicon materials can include amorphous silicon (a-Si), microcrystalline silicon, multicrystalline silicon, and monocrystalline silicon, as well as other crystal types. In another aspect, the semiconductor material can include at least one of silicon, carbon, germanium, aluminum nitride, gallium nitride, indium gallium arsenide, aluminum gallium arsenide, and combinations thereof.

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary combinations of group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, AlxGal-xAs), indium gallium arsenide (InGaAs, InxGal-xAs), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

Additionally, various types of semiconductor materials are contemplated, and any such material that can be used for the particular device design is considered to be within the present scope. In one aspect, for example, the semiconductor material is monocrystalline. In another aspect, the semiconductor material is multicrystalline. In yet another aspect, the semiconductor material is microcrystalline. It is also contemplated that the semiconductor material can be amorphous. Specific non-limiting examples include amorphous silicon or amorphous selenium.

The semiconductor materials of the present disclosure can also be made using a variety of manufacturing processes. In some cases the manufacturing procedures can affect the efficiency of the device, and can be taken into account in achieving a desired result. Exemplary manufacturing processes can include Czochralski (Cz) processes, magnetic Czochralski (mCz) processes, Float Zone (FZ) processes, epitaxial growth or deposition processes, and the like. It is contemplated that the semiconductor materials used in the present invention can be a combination of monocrystalline material with epitaxially grown layers formed thereon.

Referring to FIG. 9, a flow diagram of a method for performing nanoimprint lithography is illustrated in accordance with an example of the present technology. The method can include exposing 600 a mass transport layer adjacent to a support substrate to electromagnetic radiation to form a topography in the mass transport layer according to a predetermined pattern to form a nanoimprint lithography template. The nanoimprint lithography template can be optionally pressed against an imprint substrate to form a reverse topography of the mass transport layer topography on an imprint layer adjacent to the imprint substrate. The imprint layer can be a resist layer, although other materials can also be effectively used. The imprint substrate can be a conventional semiconductor material layer, although other materials such as, but not limited to, metals, glass, oxides, graphene, carbon nanotubes, composites thereof and the like can also be suitable. The method can include releasing the nanoimprint lithography template from the imprint substrate.

In one example, the reverse topography can be a mirror topography of the mass transport layer topography. The mirror topography can have peaks where the mass transport layer topography has valleys and valleys where the mass transport layer topography has peaks. The process of FIG. 2 illustrates creation of a mirror topography. In another example, the reverse topography is an opposite topography of the mass transport layer topography. The opposite topography can have peaks and valleys where the mass transport layer topography has peaks and valleys but in an opposite direction. The process of FIG. 4 illustrates creation of an opposite topography.

The topography can include any number of depressions and/or protrusions. Transport in the mass transport layer can be induced in different directions based on the radiation used and the specific materials chosen as the mass transport layer.

In some examples, the steps of pressing and releasing can be an initial pressing and releasing while the method can further include a subsequent pressing and releasing in a different position relative to the imprint substrate. The method can optionally include at least partially curing the imprint layer between the initial pressing and releasing step and the subsequent pressing and releasing step. In another example, the subsequent pressing and releasing step can include pressing in a position to enable closer topography feature spacing than is present on the nanoimprint lithography template. The resolution is limited by the illumination. With conventional far-field optics, the smallest structures are limited by diffraction to about half the wavelength used.

Thus, for example, for 400 nm wavelength, the smallest structure is about 200 nm. With near-field optics, there is really no limit. In other words, one can make structures as small as 10 nm. With absorbance modulation (U.S. Pat. Nos. 7,666,580; 7,667,819; 7,713,684; 7,714,988 which are each incorporated herein by reference), the resolution is virtually unlimited. The size of the topography or structure of the topography can be limited according to the size of the beam used to induce the topography. Furthermore, the height of template features can be a function of mass transport material and time of exposure.

The step of pressing in the method can transfer the imprint layer to the imprint substrate. In this example, the reverse topography is formed by providing a contact transfer layer on the mass transport layer opposite the substrate prior to the step of directing electromagnetic radiation, said contact transfer layer contacting the imprint substrate during pressing so as to form the imprint layer by leaving contacted portions of the contact transfer layer on the imprint substrate.

In another example, prior to the pressing step the imprint layer can be an unpatterned imprint layer disposed adjacent to the imprint substrate. The imprint layer can be deformed by the template during pressing to form the reverse topography. The method can also include recreating the nanoimprint lithography template or creating a different nanoimprint lithography template using the same mass transport layer.

The present technology enables high resolution template patterning for NIL, where nanoimprint templates are quickly and easily created, recreated, revised, and so forth, and which enables improved pattern resolution over previous imprinting processes. Wear of the templates as a concern is significantly reduced due to the ease and speed of recreating the templates.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology. Accordingly, it is not intended that the technology be limited, except as by the claims set forth below.

What is claimed is:

1. A method for creating a nanoimprint lithography template, comprising exposing a mass transport layer of material adjacent to a substrate to electromagnetic radiation in a predetermined pattern to form a mass transport layer topography in the mass transport layer defining a nanoimprint lithography template;
    further comprising erasing the nanoimprint lithography template by heating the mass transport layer or exposing the mass transport layer substantially uniformly to electromagnetic radiation.

2. The method of claim 1, further comprising performing nanoimprint lithography by pressing the nanoimprint lithography template against an imprint substrate to form a reverse topography of the mass transport layer topography on an imprint layer adjacent the imprint substrate; and releasing the nanoimprint lithography template from the imprint substrate.

3. The method of claim 2, wherein the reverse topography is a mirror topography of the mass transport layer topography, the mirror topography defining peaks where the mass transport layer topography defines valleys, and defining valleys where the mass transport layer topography defines peaks.

4. The method of claim 2, wherein the reverse topography is an opposite topography of the mass transport layer topography, the opposite topography defining peaks and valleys where the mass transport layer topography defines peaks and valleys oriented in an opposite direction as the mass transport layer topography.

5. The method of claim 2, wherein transmissivity of the support substrate to the electromagnetic radiation is variable to enable selective determination of the topography.

6. The method of claim 2, wherein the imprint layer is a resist layer.

7. The method of claim 6, wherein the mass transport layer has a greater rigidity than the resist layer.

8. The method of claim 2, wherein the mass transport layer comprises a member selected from the group consisting of: photochromic, thermochromic, solvatochromic, azobenzenes, spiro-oxazines, diarylethenes, sol-gels, molecules doped in polymers, photochromic polymers, small molecules deposited as thin films, and combinations thereof.

9. The method of claim 2, wherein the pressing and releasing comprises an initial pressing and releasing step in a first position relative to the imprint substrate, the method further comprising a subsequent pressing and releasing step in a different position relative to the imprint substrate to form a composite pattern.

10. The method of claim 9, further comprising at least partially curing the imprint layer between the initial pressing and releasing step and the subsequent pressing and releasing step.

11. The method of claim 9, wherein the subsequent pressing and releasing step in the different position comprises pressing in the different position to enable closer topography feature spacing than is present on the nanoimprint lithography template.

12. The method of claim 2, wherein the pressing operation transfers the imprint layer to the imprint substrate, and wherein the reverse topography is formed by providing a contact transfer layer on the mass transport layer opposite the support substrate prior to the step of directing electromagnetic radiation, said contact transfer layer contacting the imprint substrate during pressing so as to form the imprint layer by leaving contacted portions of the contact transfer layer on the imprint substrate.

13. The method of claim 2, wherein the pressing operation transfers the imprint layer to the imprint substrate, and wherein the reverse topography is formed by providing a contact transfer layer on the imprint substrate, said contact transfer layer contacting the mass transport layer topography of the nanoimprint lithography template during pressing such that contacted portions are removed from the contact transfer layer so as to form the imprint layer by leaving non-contacted portions of the contact transfer layer on the imprint substrate.

14. A nanoimprint lithography system, comprising:
    a support substrate transmissive to electromagnetic radiation;
    a mass transport layer comprising a mass transport material and disposed adjacent to the support substrate;
    an electromagnetic radiation source positioned to emit electromagnetic radiation toward the mass transport layer to create a nanoimprint lithography template by inducing a topography in the mass transport layer; and
    a nanoimprint lithography template eraser operable to erase the nanoimprint lithography template.

15. The system of claim 14, wherein the nanoimprint lithography template eraser comprises at least one of a substantially uniform electromagnetic radiation source and a heat source configured to heat the mass transport layer.

16. The system of claim 14, further comprising an etching system for etching a semiconductor material according to an imprint of the nanoimprint lithography template.

17. The system of claim 14, wherein transmissivity of the support substrate to the electromagnetic radiation is variable to enable selective determination of the topography to be induced.

18. The system of claim 14, wherein the mass transport layer comprises a photochromic material.

19. The system of claim 14, further comprising an imprint layer adjacent to the mass transport layer.

* * * * *